(12) United States Patent
Miller

(10) Patent No.: US 6,910,268 B2
(45) Date of Patent: Jun. 28, 2005

(54) METHOD FOR FABRICATING AN IC INTERCONNECT SYSTEM INCLUDING AN IN-STREET INTEGRATED CIRCUIT WAFER VIA

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 116 days.

(21) Appl. No.: 09/819,181

(22) Filed: Mar. 27, 2001

(65) Prior Publication Data

US 2002/0139577 A1 Oct. 3, 2002

(51) Int. Cl.[7] .................................................. H01K 3/10
(52) U.S. Cl. ............................ 29/852; 29/846; 427/97; 427/99; 83/929.1; 257/622
(58) Field of Search .......................... 257/622; 29/852; 427/97, 99; 83/929.1, 929.2

(56) References Cited

U.S. PATENT DOCUMENTS

| | | | |
|---|---|---|---|
| 3,648,131 A | * | 3/1972 | Stuby ........................ 257/622 |
| 3,781,683 A | | 12/1973 | Freed |
| 3,849,872 A | | 11/1974 | Hubacher |
| 4,984,358 A | | 1/1991 | Nelson |
| 5,185,502 A | | 2/1993 | Shepherd et al. |
| 5,317,479 A | | 5/1994 | Pai et al. |
| 5,371,654 A | | 12/1994 | Beaman et al. |
| 5,373,627 A | | 12/1994 | Grebe |
| 5,386,341 A | | 1/1995 | Olson et al. |
| 5,442,282 A | | 8/1995 | Rostoker et al. |
| 5,822,856 A | | 10/1998 | Bhatt et al. |
| 5,832,600 A | * | 11/1998 | Hashimoto ................... 29/852 |
| 5,847,445 A | | 12/1998 | Wark et al. |

(Continued)

FOREIGN PATENT DOCUMENTS

| | | |
|---|---|---|
| JP | 7-021968 | 1/1995 |
| JP | 7-333232 | 12/1995 |
| WO | WO 00/75985 A1 | 12/2000 |

OTHER PUBLICATIONS

Gregus, Jeffrey A., Maureen Y. Lau, Yinon Degani and King L. Tai, "Chip–Scale Modules for High–Level Integration in the 21st Century," *Bell Labs Technical Journal*, Jul.–Sep. 1998, pp. 116–124.

Mehra, Amit, Zin Zhang, Arturo A, Ayón, Ian A. Waitz, Martin A. Schmidt, "Through–wafer Electrical Interconnect for Multilevel Microelectromechanical System Devices," *J. Vac. Sci. Technol. B 18(5)*, Sep./Oct. 2000, pp. 2583–2589.

"Through–Wafer Electrical Interconnects Compatible With Standard Semiconductor Processing," mhtml:file:// C:\TEMP\Eugene Chow hilton head.mht, Sep. 25, 2000.

Murphy, Tom, "Tru–Si Technologies Makes Wafer Stacking a Possibility," *Electronic News (1991)*, Dec. 6, 1999.

"2D Microcantilever Arrays with Through–Wafer Interconnects," http://www.stanford.edu/ ~emc/2dpicts.html, Dec. 14, 2000.

"Employment of the Deep Plasma Silicon Etching for the Production of New Microfluidic Components," http:// 222.tu–dresden.de/etihm/english/research/hlt/ihm_eng/fo_pro_e/fra_e012.html, Dec. 15, 2000.

"Advanced Silicon Etched (ASE)", http://www. stsystems.com/ase.html, Jan. 15, 2001.

*Primary Examiner*—Richard Chang
(74) *Attorney, Agent, or Firm*—Fliesler Meyer LLP

(57) ABSTRACT

Vertical holes are created in streets separating individual integrated circuit (IC) dies formed on a semiconductor wafer, the holes spanning saw-lines along which the wafer is to be later cut to separate the IC die from one another to form individual IC chips. The holes are then filled with conductive material. After the wafer is cut along the saw-lines, portions of the conductive material on opposing sides of the saw-lines remain on peripheral edges of the IC chip to form signal paths between the upper and lower surfaces of the IC chips.

9 Claims, 6 Drawing Sheets

U.S. PATENT DOCUMENTS

| | | |
|---|---|---|
| 5,914,218 A | 6/1999 | Smith et al. |
| 5,915,170 A | 6/1999 | Raab et al. |
| 5,969,952 A | 10/1999 | Hayashi et al. |
| 5,998,864 A | 12/1999 | Khandros et al. |
| 6,002,163 A | 12/1999 | Wojnarowski |
| 6,017,613 A | 1/2000 | Baum et al. |
| 6,051,866 A | 4/2000 | Shaw et al. |
| 6,059,982 A | 5/2000 | Palagonia et al. |
| 6,072,190 A | 6/2000 | Watanabe et al. |
| 6,080,596 A | 6/2000 | Vindasius et al. |
| 6,114,221 A | 9/2000 | Tonti et al. |
| 6,214,641 B1 | 4/2001 | Akram |
| 6,228,676 B1 * | 5/2001 | Glenn et al. ............... 438/107 |
| 6,330,164 B1 | 12/2001 | Khandros et al. |
| 6,336,269 B1 | 1/2002 | Eldridge et al. |

* cited by examiner

METHOD FOR FABRICATING AN IC INTERCONNECT SYSTEM INCLUDING AN IN-STREET INTEGRATED CIRCUIT WAFER VIA

BACKGROUND OF THE INVENTION

1. Field of the Invention

The present invention relates in general to electrical interconnect systems for linking integrated circuit chips and in particular to an interconnect system employing a vertical signal path along an edge of an integrated circuit chip.

2. Description of Related Art

Figure 1:
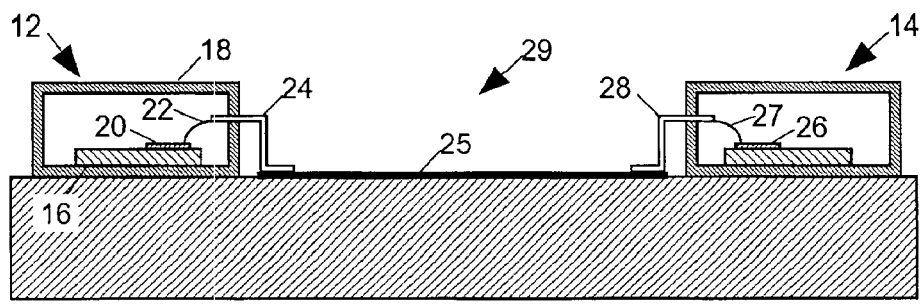

FIG. 1 is a simplified sectional elevation view of a prior art interconnect system for linking two integrated circuits (ICs) 12 and 14 mounted on a printed circuit board (PCB) 10. IC 12 includes an integrated circuit chip 16 contained within an IC package 18. A bond pad 20 on the surface of chip 16 acts as an input/output (I/O) terminal for signals entering and/or departing chip 16. A typical IC will include several bond pads, but for simplicity only one is shown in FIG. 1. A bond wire 22 links bond pad 20 to a package pin 24 extending outward from package 18. Pin 24 is soldered onto a microstrip trace 25 on the surface of PCB 10. Bond wire 22 and pin 24 together form a path for conveying signals between bond pad 20 and PCB trace 25. A bond pad 26 in IC 14 is connected to microstrip trace 25 in a similar manner through a bond wire 27 and a package pin 28.

A signal traveling between the bond pads of the two ICs 12 and 14 thus traverses an interconnect system 29 comprising two bond wires 22 and 27, two package pins 24 and 28, and trace 25. Since interconnect system 29 delays the signal in proportion to its signal path length, we can reduce the interconnect system's signal path delay by reducing its length. For example, we can make bond wires 22 and 27, pins 24 and 28, and trace 25 as short as possible to reduce signal path delay in the interconnect system of FIG. 1. However, since pads 20 and 26 reside in different IC packages there is a limit to how short we can make the signal path.

Hybrid Circuits

Figure 2:
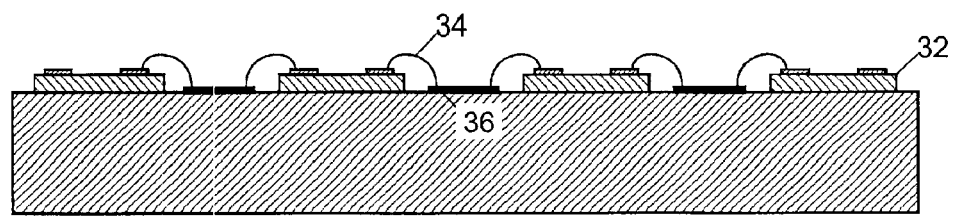

FIG. 2 is a simplified sectional elevation view of a prior art hybrid circuit interconnect system containing four unpackaged IC chips 32 directly mounted on a PCB 30. ICs 32 communicate with one another through signal paths comprising only bond wires 34 and microstrip traces 36. Since IC chips 32 are not separately packaged, the hybrid circuit interconnect system eliminates package pins from all signal paths between the chips thereby reducing interconnect system length and signal path delay.

Figure 3:
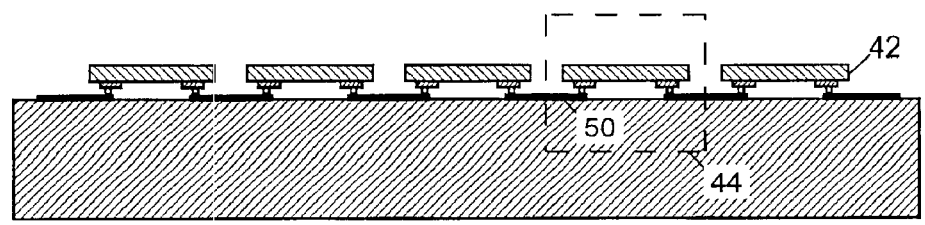
Figure 3A:
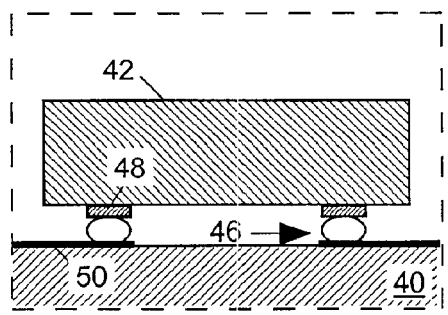
Figure 3B:
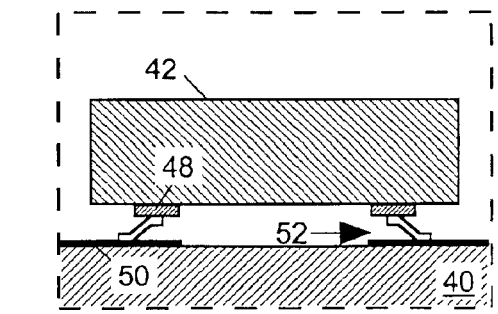

FIG. 3 is a simplified sectional elevation view of a prior art "flip-chip" hybrid circuit wherein IC chips 42 are mounted face-down on a PCB 40. FIG. 3A illustrates in greater detail a region 44 of FIG. 3 wherein solder balls 46, when melted, attach bond pads 48 of one IC chip 42 to microstrip traces 50 residing on PCB 40. Alternatively, spring contacts 52 (FIG. 3B) can connect bond pads on IC chip 42 to traces 50. The flip-chip interconnect system further reduces signal path lengths and delays by eliminating bond wires from signal paths between ICs.

Figure 4:
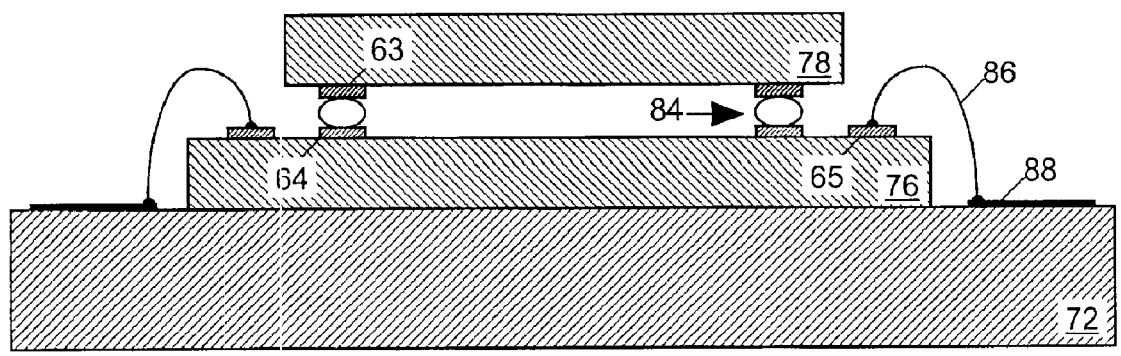

FIG. 4 is a simplified sectional elevation view of a prior art "stacked" flip-chip hybrid circuit 70 wherein an IC chip 78 is mounted directly on another IC chip 76 residing on a PCB 72. Solder 84 links bond pads 63 and 64 of IC chips 76 and 78. Bord wires 86 link bond pads 65 on IC chip 76 to microstrip traces 88 on PCB 72. The "stacked" flip-chip interconnect system eliminates bond wires and traces from signal paths between two ICs. However it still requires bond wires to connect more than two ICs since normally only two ICs can be directly linked to one another.

Electrical Through-Wafer Interconnects

Electrical Through-Wafer Interconnect (ETWIs) systems enable stacking of more than two IC chips by employing conductive "vias" routing electrical signals vertically through IC chips.

Figure 5:
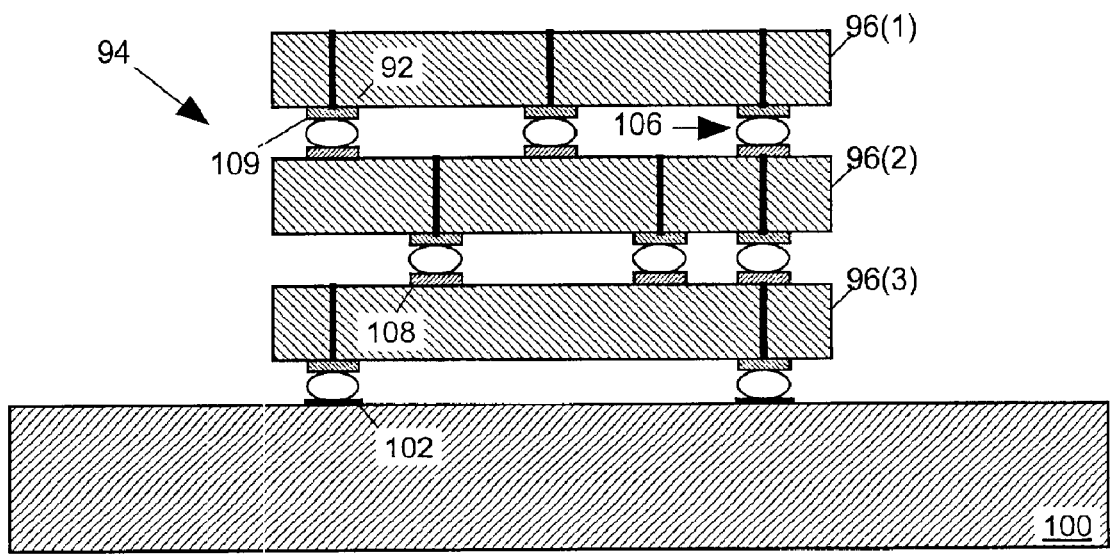

FIG. 5 is a simplified sectional elevation view of a hybrid circuit 90 containing a stack 94 of IC chips 96(1)–96(3) interconnected by a set of vias 92 passing vertically through the substrates of IC chips 96(1)–96(3) and linking bond pads 109 and 108 residing on upper and lower surfaces of the IC chips. Stack 94 resides on a PCB 100 having a set of microstrip traces 102. Solder 106 directly links bond pads 109 on IC under sides to bond pads 108 on the top sides of adjacent IC chips or to traces 102 on PCB 100. The ETWI system thus eliminates bond wires from connecting between several ICs 96.

Figure 6A:
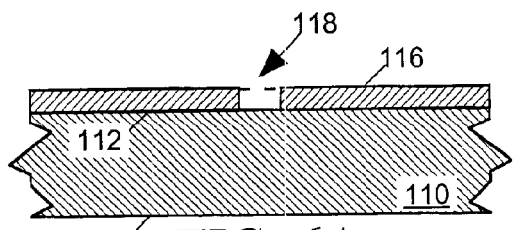
Figure 6B:
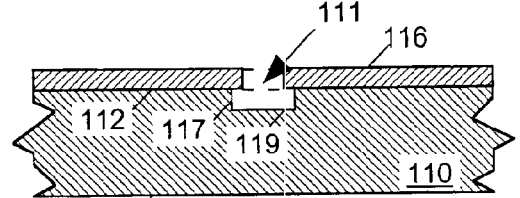
Figure 6C:
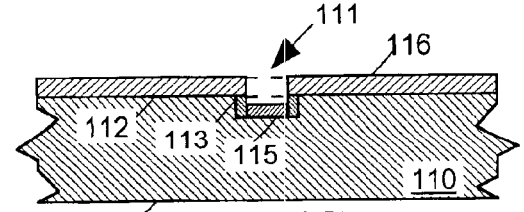

FIGS. 6A–6E are simplified partial sectional views illustrating a prior art method for forming a via through an IC substrate 110. In FIG. 6A a patterned resist layer 116 coats an upper surface 112 of IC substrate 110 exposing an area 118 in which an ETWI is to be formed. Area 118 is isotropically etched (FIG. 6B) to form a void 111 having walls 117 in substrate 110. Each etch step (FIG. 6B) is followed by a passivation step (FIG. 6C) wherein the walls 117 of void 111 are passivated to prevent further etching of these surfaces to form a high-aspect ratio hole. In FIG. 6C a protective layer 115 is photo-lithographically formed on a lower surface 119 of void 111. After formation of layer 115 a passivation gas is introduced to void 111 to passivate walls 117 of void 111 and form a passivation layer 113. Layer 115 prevents the passivation of lower surface 119 and is removed after each passivation step to expose that surface to further etching.

Figure 6D:
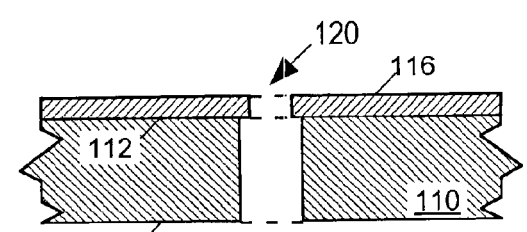
Figure 6E:
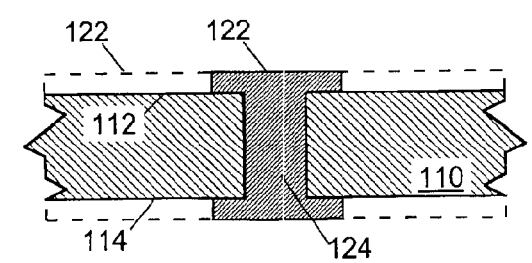

For a typical IC substrate 110 having a thickness of greater than 1000 microns, the etch and passivation steps of FIGS. 6B–6C must be repeated many times to form a high aspect-ratio hole 120 of FIG. 6D extending completely through substrate 110. After forming hole 120, resist layer 116 (FIGS. 6A–6D) is removed and a conductive layer 122 is formed (FIG. 6D) on substrate 110 filling hole 120. Portions of layer 122 are then removed photo-lithographically to yield an ETWI 124 extending between upper and lower surfaces 112 and 114 of substrate 110 as illustrated in FIG. 6E.

Figure 7A:
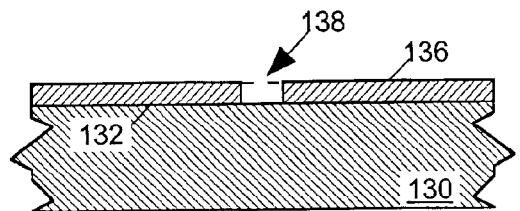
Figure 7B:
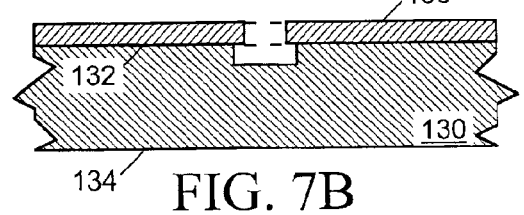
Figure 7C:
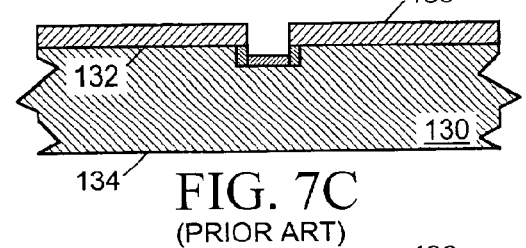
Figure 7D:
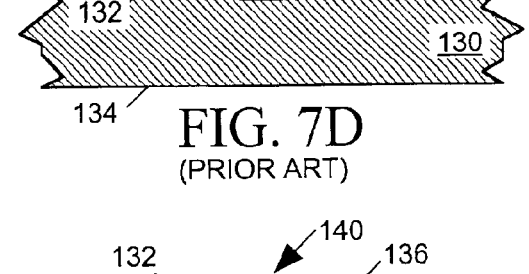
Figure 7E:
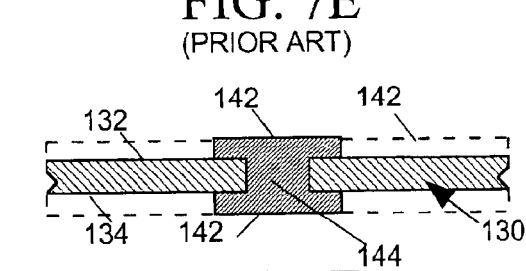
Figure 7F:

FIGS. 7A–7F are simplified partial sectional views illustrating an alternative prior art method for forming an ETWI. A patterned resist layer 136 coats an upper surface 132 of an IC substrate 130 exposing an area 138 of that upper surface. The exposed area 138 of upper surface 132 is then etched several times (FIGS. 7B–7C) in a manner similar to that described above for FIGS. 6B–6C. However the process is halted after forming a shallow hole 140 that does not extend completely through substrate 130. Thereafter substrate 130 is "thinned" (FIG. 7E) by etching a lower surface 134 of substrate 130 in a blanket or bulk fashion so that hole 140 passes through the thinned substrate 130. The bulk etching step of FIG. 7E does not require photolithography techniques and therefore is relatively inexpensive. As illustrated in FIG. 7F, the resist layer 136 (FIGS. 7A–7D) is removed from substrate 130 and a conductive layer 142 is formed thereon completely filling hole 140 of FIG. 7E. Portions of layer 142 are then removed photo-lithographically to yield an ETWI 144 extending between upper and lower surfaces 132 and 134 of substrate 130 through hole 140.

The lithographically-defined etching techniques described above can make small diameter, high aspect-ratio holes but these techniques are slow and expensive. Less expensive techniques such as laser or mechanical drilling produce large holes that take up too much surface area in the IC.

What is needed is an economical system for quickly forming vertical signal paths in an IC substrate that do not occupy space on the substrate that could otherwise be used for IC components.

BRIEF SUMMARY OF THE INVENTION

In accordance with a first embodiment of the invention a set of holes are formed through a semiconductor wafer or substrate along a wafer "saw-line" where a saw or other cutting tool will later cut the wafer to separate individual IC die formed on the wafer. The wafer is then coated with a passivation layer (e.g., silicon nitride) patterned to expose bond pads on the IC die. A layer of conductive material (e.g., titanium-tungsten) is then deposited on the wafer's upper and lower surfaces and on the side walls of the holes in contact with the bond pads. The conductive material is then patterned using photolithography techniques to define conductive paths on the upper and lower surfaces electrically interconnected through the conductive material coating the hole walls. The holes are larger in diameter than the saw-line so that when the wafer is thereafter cut along the saw-lines, remaining portions of the conductive layer form vertical signal paths around edges of the resulting IC chips.

In accordance with a second embodiment of the invention a set of holes are formed through a semiconductor wafer along a wafer saw-line where a saw or other cutting tool will later cut the wafer to separate individual IC die formed on the wafer. The wafer is then coated with a passivation layer (e.g., silicon nitride) photolithographically patterned such that bond pads of ICs residing on an upper surface of the wafer are exposed. A conductive layer (e.g., titanium-tungsten) is then applied and patterned such that conductive traces are formed extending from the bond pads towards the upper openings of the wafer holes. A layer of masking material (e.g., photoresist) is then applied to the wafer and patterned such that it coats only the hole walls and a portion of the lower surface of the wafer and so that bumps are formed on the layer pointing away from the lower surface of the wafer. A layer of conductive seed material (e.g., gold) is then applied and patterned such that it covers the previously patterned conductive traces and masking layer. Thereafter a layer of resilient, conductive material (e.g., nickel) is plated onto the layer of seed material. The wafer holes are sufficiently large that after the wafer is plated with the conductive layer and cut along the saw-line, remaining portions of the conductive layer form vertical signal paths around edges of the resulting IC chips. The layer of masking material is then removed from those IC chips to form spring contacts on the IC chips providing vertical signal paths from the bond pads of the ICs around outer edges of the IC chips. The spring contacts terminate in contact points formed by the bumps previously patterned into the masking layers and pointing away from the lower surfaces of the IC chips.

It is accordingly an object of the invention to provide an economical method for forming vertical signal paths around edges of an IC chip.

The claims portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 8:
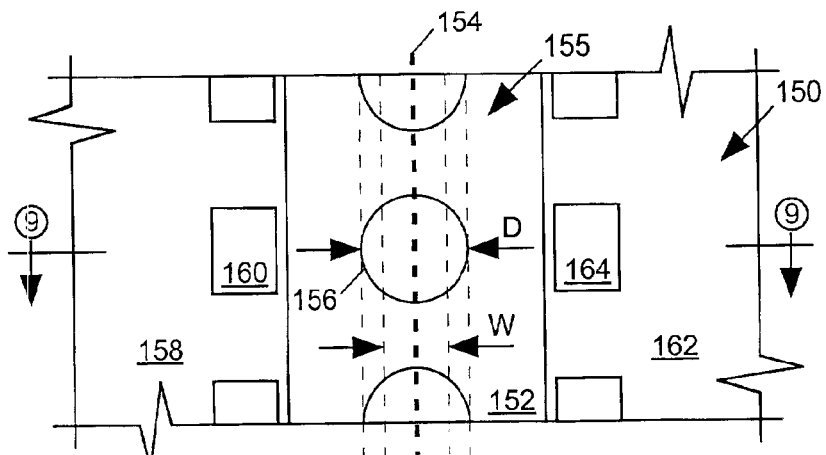
Figure 9A:
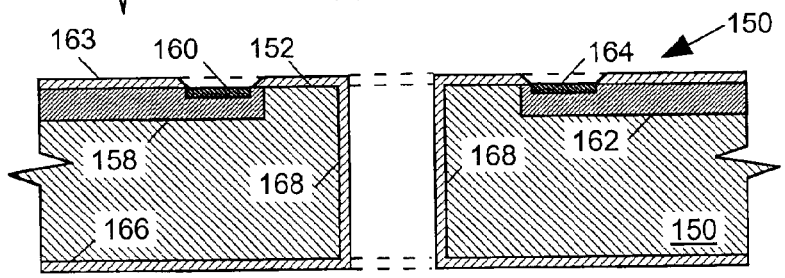
Figure 9B:
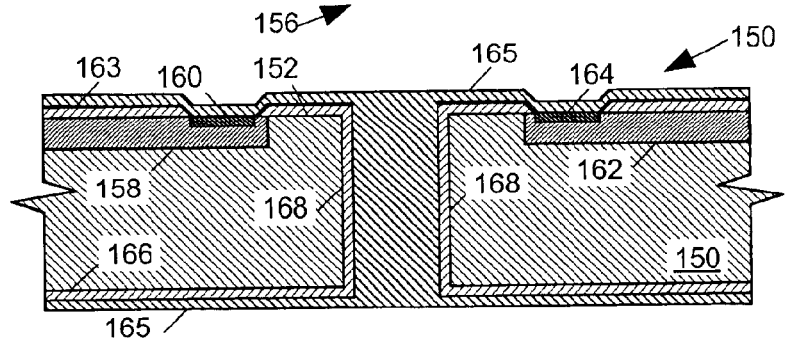
Figure 9C:
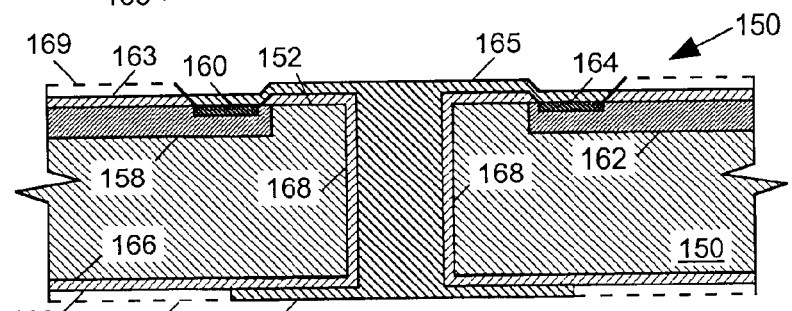
Figure 9D:
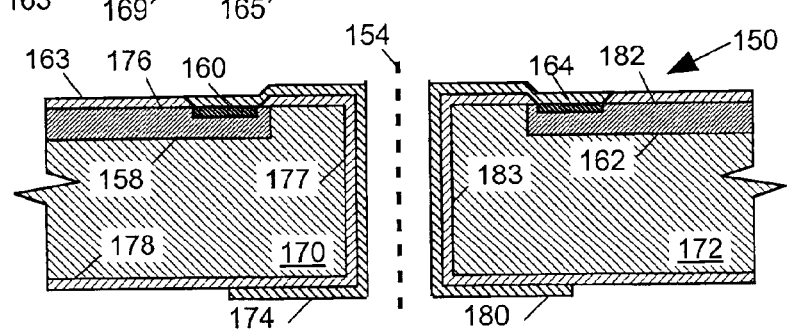
Figure 10:
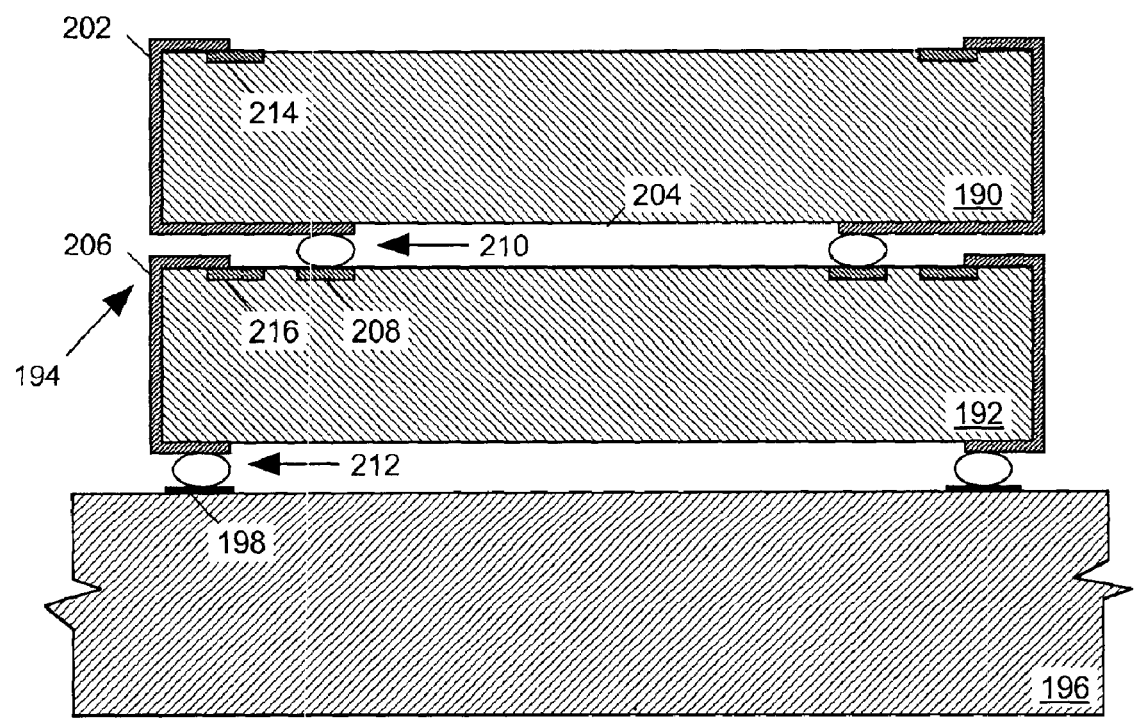
Figure 12:
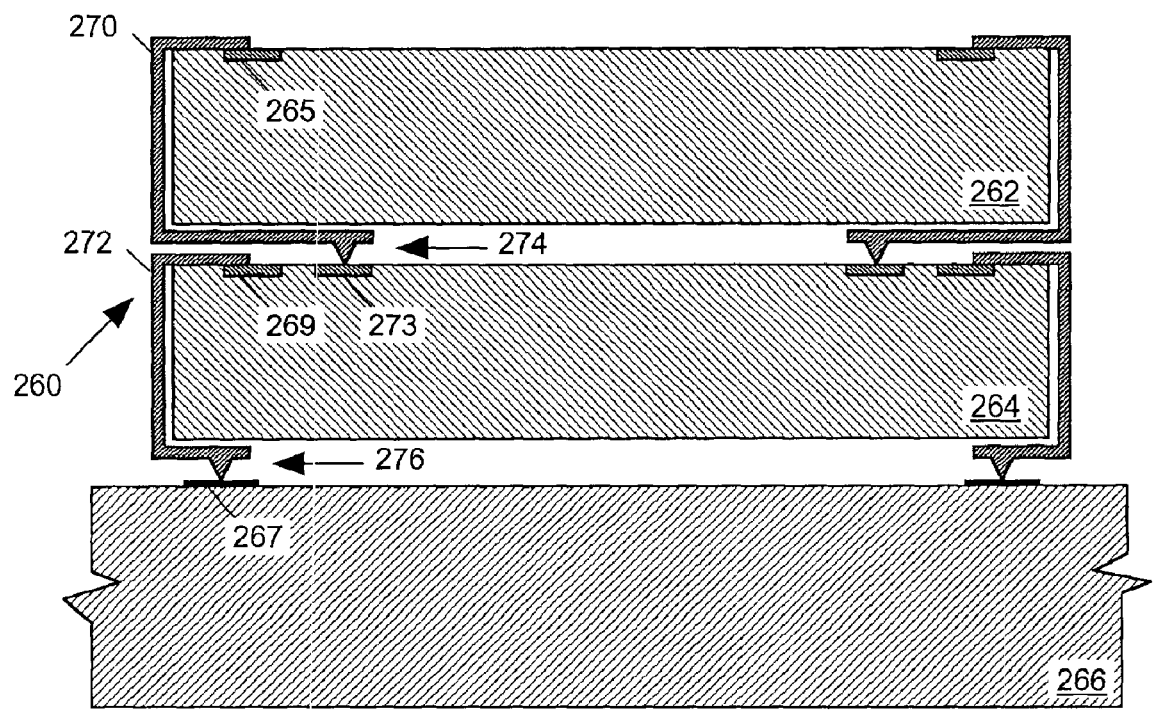

FIG. 1 is a simplified sectional elevation view of a portion of a typical integrated circuit (IC) based electronic device, FIG. 2 is a simplified sectional elevation view of a prior art hybrid circuit, FIG. 3 is a simplified sectional elevation view of a prior art flip-chip hybrid circuit, FIG. 4 is a simplified sectional elevation view of another prior art flip-chip hybrid circuit, FIG,. 5 is a simplified sectional elevation view of a prior art stack of interconnected IC chips, FIGS. 6A–6E are simplified partial sectional elevation views illustrating a prior art method for forming an electrical through-wafer interconnect, FIGS. 7A–7F are simplified partial sectional elevation views illustrating an alternative prior art method for forming an electrical through-wafer interconnect, FIG. 8 is a simplified partial plan view of a portion of an IC semiconductor wafer having a through-wafer hole formed along a saw-line in accordance with the invention, FIGS. 9A–9D are simplified sectional elevation views along section 9—9 in FIG. 8 illustrating respective steps of a method for fabricating a vertical signal path in an IC semiconductor wafer in accordance with a first embodiment of the invention, FIG. 10 is a simplified sectional elevation view of a stack of IC chips interconnected using signal paths formed in accordance with the first embodiment of the invention, FIGS. 11A–11E are simplified partial sectional elevation views illustrating respective steps of a method for fabricating a vertical signal path in an IC semiconductor wafer in accordance with a second embodiment of the invention, and FIG. 12 is a simplified sectional elevation view of a stack of IC chips interconnected using signal paths formed in accordance with the second embodiment of the invention.

DETAILED DESCRIPTION OF THE INVENTION

The present invention provides vertical signal paths between upper and lower surfaces of an integrated circuit (IC) semiconductor chip. In conventional IC production, ICs are fabricated in bulk as identical die forming a die matrix on a semiconductor wafer or substrate. The wafer is then cut with a saw along a series of saw-lines or "streets" located between adjacent rows and columns of the die matrix to separate the die from one another. In accordance with the invention the vertical signal paths are formed in holes extending through the street areas of the wafer.

FIG. 8 is a simplified plan view of a portion of the upper surface 152 of an IC semiconductor wafer 150 showing a pair of die 158 and 162 occupying adjacent columns of a die matrix and having respective bond pads 160 and 164 on their upper surfaces. In accordance with the invention a set of holes 156 are formed along a saw-line 154 in the street 155 between ICs 158 and 162 that a cutting tool (not shown) will follow when later cutting wafer 150 to separate die 158 and 162 into corresponding IC chips. Each hole 156 has an inside diameter D greater than the width W of wafer material removed when the cut is made along saw-line 154.

FIGS. 9A–9D are simplified sectional elevation views along section 9—9 in FIG. 8 illustrating respective steps of a method for fabricating vertical signal paths through holes 156 in wafer 150 in accordance with the invention.

FIG. 9A shows upper and lower wafer surfaces 152 and 166 respectively of wafer 150 and the inner wall 168 of hole 156. Before cutting wafer 150, a layer 163 of passivating material (e.g., silicon nitride) is applied (FIG. 9B) to both sides of wafer 150 and through hole 156. A portion of layer 163 is then removed photo-lithographically to expose bond pads 160 and 164 on the upper surface 152 of wafer 150. A layer 165 of conductive material (e.g., titanium tungsten) is then applied (FIG. 9B) to coat all of passivation layer 163, bond pads 160 and 164 and fills holes 156. Conductive layer 165 is then photolithographically patterned to remove portions 169 of the layer 165 (FIG. 9C).

As illustrated in FIG. 9D, wafer 150 of FIGS. 9A–9C is then cut along saw-line 154 to separate chips 170 and 172. A remaining portion of layer 165 forms a signal path 174 traversing an outer edge 177 of chip 170 between bond pad 160 and a lower surface 178 of the chip. Chip 172 also retains a signal path 180 traversing an outer edge 183 between bond pad 164 and its lower surface 180.

Although FIGS. 9B and 9C show layer 165 filling hole 156, layer 165 could alternatively coat layer 163 along wall 168 of hole 156 without completely filling hole 156.

FIG. 10 is a simplified sectional elevation view of a stack 194 of two IC chips 190 and 192 interconnected using vertical signal paths 202 and 206 formed in accordance with the first embodiment of the invention. Stack 194 is mounted on a substrate 196 such as for example a printed circuit board having a set of microstrip traces 198. Solder 210 links interconnects 202 on chip 190 to bond pads 208 on chip 192 while solder 212 links interconnects 206 on chip 192 to traces 198 on substrate 196. By routing signals along external interconnects such as interconnects 202 and 206 formed in accordance with the first embodiment of the invention, stack 194 provides reduced signal path lengths between ICs while refraining from using additional area on the upper surfaces of those IC chips that could otherwise be used for the placement of circuit components. Although stack 194 of FIG. 10 contains two chips 190 and 192 those of ordinary skill in the art will recognize that a larger number of chips may be stacked in a similar manner.

FIGS. 11A–11E are simplified partial sectional elevation views illustrating respective steps of a method for fabricating a vertical signal path in an IC semiconductor wafer 220 in accordance with a second embodiment of the invention. Semiconductor wafer 220 includes upper and lower surfaces 222 and 224 and contains a pair of IC die 226 and 228 having bond pads 230 and 232 respectively. A hole 234 of diameter D and having walls 236 is mechanically or laser drilled or etched through wafer 220 along a saw-line 238. Upper and lower surfaces 222 and 224 and hole walls 236 are coated with a layer 231 of a passivating material (e.g., silicon nitride) patterned to expose bond pads 230 and 232.

Figure 11A:
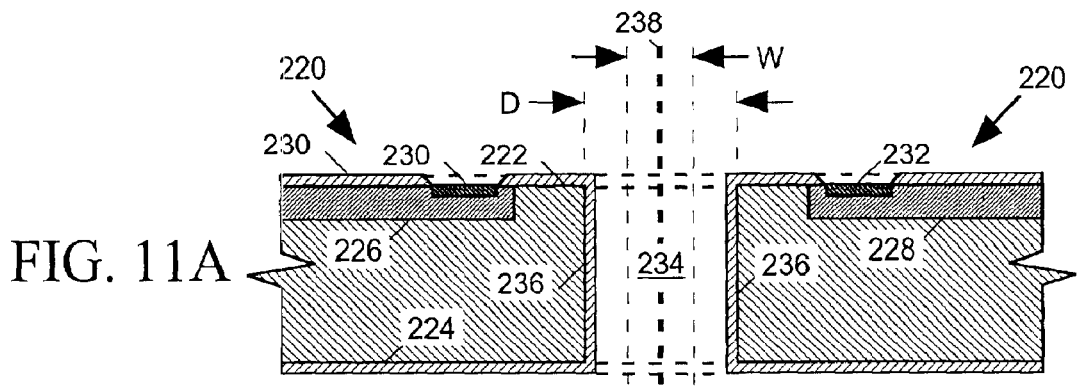
Figure 11B:
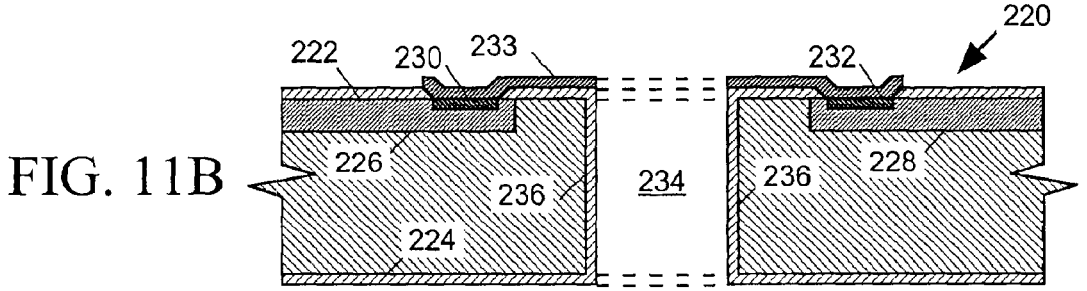
Figure 11C:
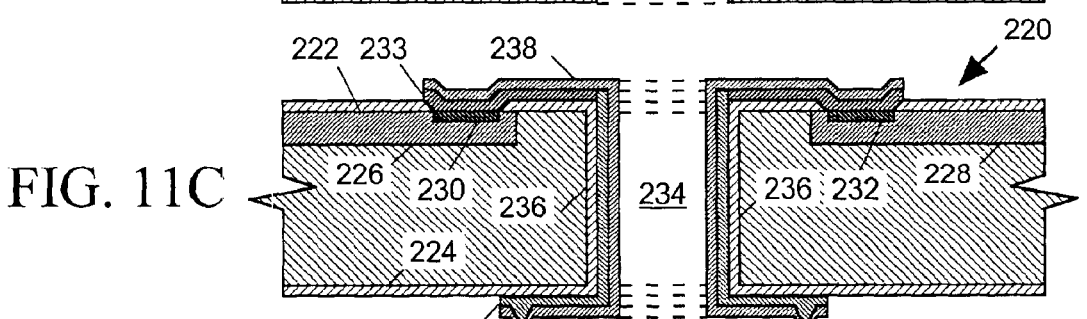
Figure 11D:
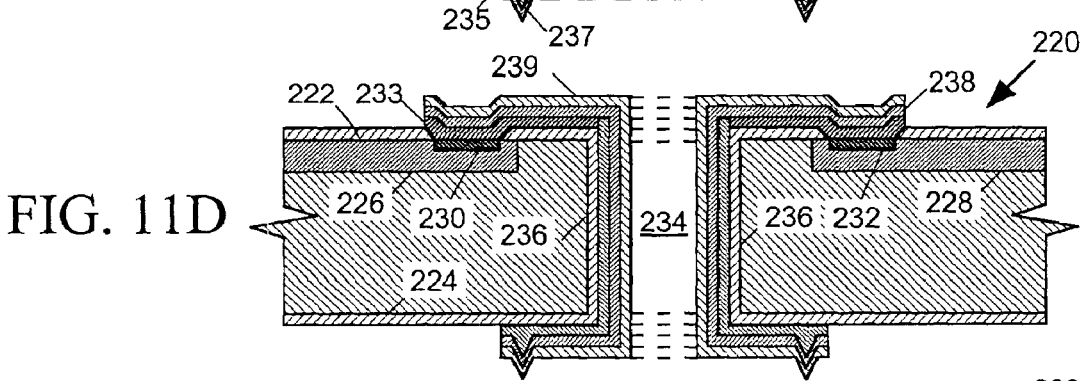

In FIG. 11B a layer 233 of a conductive material (e.g., titanium-tungsten) is applied to wafer 220 and patterned to coat both bond pads 230 and 232 and to form a conductive path from those bond pads to the edge of hole 234. A layer 235 of masking material (e.g., photoresist) is then deposited on wafer 220 (FIG. 11C) and patterned such that it coats layer 231 along walls 236 and part way along lower surface 224 and to form a bump 237 facing away from lower surface 224. A layer 238 of conductive seed material (e.g., gold) is then applied to wafer 220 and patterned such that it coats all of layers 233 and 235. FIG. 11D illustrates the subsequent plating of a layer 239 of resilient conductive material (e.g., nickel) onto layer 238.

Figure 11E:
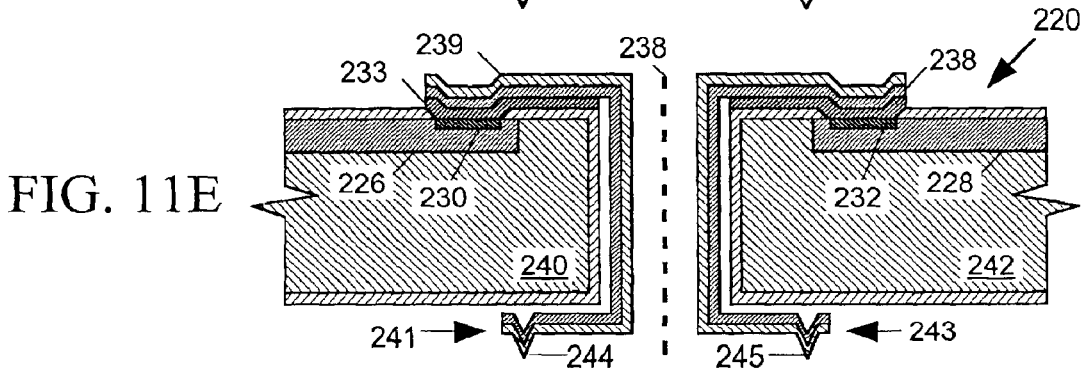

As seen in FIG. 11E, wafer 220 is cut to separate die 226 and 228 of FIGS. 11A–11D into respective IC chips 240 and 242. Layer 235 is also removed from chips 240 and 242 using a solvent (e.g., acetone) thereby forming spring contacts 241 and 243 having contact tips 244 and 245 and linked to bond pads 230 and 232 respectively.

FIG. 12 is a simplified sectional elevation view of a stack 260 of two IC chips 262 and 264 interconnected using signal paths 270 and 272 formed in accordance with the invention. IC chips 262 and 264 are mounted on a substrate 266 having a set of traces 267. Bond pad 265 of IC 262 communicates with bond pad 273 of IC 264 through interconnect 270. Bond pad 269 of IC 264 communicates with trace 267 through interconnect 277.

Thus has been shown and described a method for fabricating a vertical signal path on a semiconductor substrate traversing an outer edge of that substrate. Since the vertical signal path is formed within a through-wafer hole located on a semiconductor wafer saw-line and since the hole may be of relatively large diameter, quick and relatively inexpensive techniques such as mechanical or laser drilling may be used for forming that hole.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for fabricating an interconnect system for providing a signal path to a first circuit node of an integrated circuit (IC) formed within and on a portion of a semiconductor wafer having horizontal upper and lower surfaces, the method comprising the steps of:

a. forming a hole extending vertically through an area of the semiconductor wafer adjacent to the portion of the wafer containing the IC, b. placing the first conductive material in the hole, the first conductive material vertically extending through the hole, c. conductively linking the first conductive material to the first circuit node, and d. cutting the semiconductor wafer vertically along a horizontal line extending across the hole such that a portion of the semiconductor wafer containing the IC includes a peripheral edge formed along the saw-line upon which a portion of the first conductive material placed in the hole remains attached.

2. The method in accordance with claim 1 further comprising a step of:

e. forming a bond pad on the lower surface of the semiconductor wafer conductively linked to the conductive material placed in the hole.

3. The method in accordance with claim 1 further comprising a step of:

e. providing second conductive material extending horizontally from the first conductive material along and attached to the lower surface of the semiconductor wafer under the portion of the semiconductor wafer containing the IC.

4. The method in accordance with claim 1 wherein step c comprises a step of:

e. providing second conductive material extending horizontally on the upper surface of the semiconductor wafer and on the IC from the first conductive material to the first circuit node.

5. The method in accordance with claim 4 further comprising a step of:
   f. providing third conductive material extending horizontally from the first conductive material along and attached to the lower surface of the semiconductor wafer under the portion of the semiconductor wafer containing the IC.

6. The method in accordance with claim 3 further comprising to steps of:
   e. coating a portion of the conductive material extending along and attached to the lower surface of the portion of the semiconductor wafer containing the IC with resilient material, and
   f. detaching the portion of the conductive material coated with resilient material from the lower surface of the portion of the semiconductor wafer containing the IC so that it forms a spring contact linked by the conductive material to the first circuit node.

7. The method for fabricating an interconnect system of claim 1 further providing for additional signal paths between additional circuit nodes formed within and on the semiconductor wafer, the method comprising the steps of:
   a. forming additional holes extending vertically through the semiconductor wafer in areas of the semiconductor wafer between areas defining IC dice,
   b. placing additional first conductive material in the additional holes formed in the semiconductor wafer,
   c. placing second conductive material on the upper surfaces of wafer forming an upper surface of the IC dice, the second conductive material forming signal paths extending horizontally between the additional circuit nodes and the first conductive material placed in the holes, and
   d. cutting the wafer in the areas between the dice along a line extending through the additional holes so as to singulate the IC dice and so that portions of the first conductive material remain on the IC dice after the IC dice are singulated to provide conductive paths between the second conductive material on the upper surfaces of the IC dice and lower surfaces of the IC dice.

8. The method in accordance with claim 7 further comprising the step of:
   e. prior to cutting the wafer at step d, forming conductive pads on the lower surfaces of the IC dice that are conductively linked to the first conductive material placed in the holes.

9. The method in accordance with claim 1 further comprising the step of:
   e. prior to cutting the wafer at step d, forming conductive pads on the lower surfaces of the IC dice that are conductively linked to the first conductive material planed in the holes.

* * * * *